US007659706B2

United States Patent
Nishida

(10) Patent No.: US 7,659,706 B2
(45) Date of Patent: Feb. 9, 2010

(54) CURRENT DETECTOR CIRCUIT AND CURRENT-MODE DC-DC CONVERTER USING SAME

(75) Inventor: Junji Nishida, Osaka (JP)

(73) Assignee: Ricoh Company, Ltd., Tokyo (JP)

(*) Notice: Subject to any disclaimer, the term of this patent is extended or adjusted under 35 U.S.C. 154(b) by 318 days.

(21) Appl. No.: 11/714,365

(22) Filed: Mar. 5, 2007

(65) Prior Publication Data
US 2007/0263334 A1 Nov. 15, 2007

(30) Foreign Application Priority Data
Mar. 6, 2006 (JP) .............................. 2006-059494

(51) Int. Cl.
G05F 3/16 (2006.01)
G05F 3/20 (2006.01)
(52) U.S. Cl. .................... 323/314; 323/316; 323/907
(58) Field of Classification Search ................. 323/268, 323/273, 282, 312–314, 316, 907; 327/103, 327/108, 538, 543; 324/76, 18, 76.75, 609, 324/618
See application file for complete search history.

(56) References Cited

U.S. PATENT DOCUMENTS

| 5,717,322 | A | * | 2/1998 | Hawkes et al. | ............... | 323/283 |
| 5,825,234 | A | * | 10/1998 | Sung et al. | .................. | 327/378 |
| 6,424,131 | B1 | * | 7/2002 | Yamamoto et al. | .......... | 323/282 |
| 6,937,001 | B2 | * | 8/2005 | Ueda | .......................... | 323/313 |
| 7,336,122 | B2 | * | 2/2008 | Ko et al. | ..................... | 327/538 |

FOREIGN PATENT DOCUMENTS

| JP | 2000-307402 | 11/2000 |
| JP | 2002-26707 | 1/2002 |

* cited by examiner

Primary Examiner—Jessica Han
Assistant Examiner—Emily Pham
(74) Attorney, Agent, or Firm—Cooper & Dunham, LLP

(57) ABSTRACT

A current detector circuit for detecting a load current flowing through a load includes a first series circuit having a first element and the load connected in series, a second series circuit having a second element and a resistor connected in series, the second element having a temperature characteristic equal to the temperature characteristic of the resistance of the first element, a power supply configured to supply voltage to the first series circuit and the second series circuit, and a control circuit configured to control the voltage drop across the second element so that the voltage drop across the second element is equal to the voltage drop across the first element. A current detection signal corresponding to the load current is generated based on a current flowing through the second element.

25 Claims, 12 Drawing Sheets

CURRENT DETECTOR CIRCUIT AND CURRENT-MODE DC-DC CONVERTER USING SAME

BACKGROUND

1. Technical Field

This disclosure relates generally to current detector circuit technology, and more particularly to a current detector circuit having excellent temperature characteristics and a current-mode DC-DC converter using the same.

2. Description of the Related Art

FIG. 1 is a diagram showing a conventional current detector circuit that detects a current flowing through a switching device M11 at the output stage of a step-down DC-DC converter.

In this conventional case, a series circuit of a resistor Rs and a PMOS transistor M12 is connected in parallel to the switching device M11 using a PMOS transistor. Further, the gates of the switching device M11 and the PMOS transistor M12 are connected in common.

The switching device M11 and the PMOS transistor M12 are connected to ground through an NMOS transistor M16. One end of the NMOS transistor M16 is grounded, and the output voltage Vout of the DC-DC converter through a smoothing circuit formed of an inductor L1 and a capacitor C1 is extracted from the other end of the NMOS transistor M16.

A signal P applied to the gates of the switching device M11 and the PMOS transistor M12 and a signal N applied to the gate of the NMOS transistor M16 are complementary to each other. A current detection signal Vsense is extracted from the connection node of the resistor Rs and the PMOS transistor M12. The above-described complementary signals P and N are generated based on this current detection signal Vsense.

The current detection signal Vsense in this circuit is expressed as follows:

$$Vsense = IL \cdot Rm1on \cdot Rs / (Rm1on + Rm2on + Rs), \quad (1)$$

where IL is a load current, $Rm1on$ is the ON-resistance of the switching device M11, and $Rm2on$ is the ON-resistance of the PMOS transistor M12.

Normally, MOS transistors have temperature coefficients greater than that of the resistor Rs formed of a diffused resistor or the like. Therefore, Eq. (1) is rewritten into an equation in consideration of temperature, which is expressed as follows:

$$Vsense = IL \cdot Rm1on(1+\Delta t \cdot \gamma) \cdot Rs / (Rm1on(1+\Delta t \cdot \gamma) + Rm2on(1+\Delta t \cdot \gamma) + Rs), \quad (2)$$

where $\Delta t$ is a change in temperature, $\gamma$ is the temperature coefficient of the ON-resistance of each MOS transistor, and the temperature coefficient of the resistor Rs is 0.

Dividing each of the numerator and the denominator of Eq. (2) by $(1+\Delta t \cdot \gamma)$ results in:

$$Vsense = IL \cdot Rm1on \cdot Rs / (Rm1on + Rm2on + Rs/(1+\Delta t \cdot \gamma)), \quad (3)$$

thus leaving the term $(1+\Delta t \cdot \gamma)$ showing temperature dependence in the equation. This shows that the current detection signal Vsense has temperature dependence. Therefore, temperature compensation is necessary in current detector circuits having circuit configurations as described above.

FIG. 2 is a diagram showing a current detector circuit disclosed in Japanese Laid-Open Patent Application No. 2000-307402.

As shown in FIG. 2, in this current detector circuit, a series circuit of an NMOS transistor M22, the resistor Rs, and a heat-sensitive element 5 is connected in parallel to an NMOS transistor M21, so that temperature compensation of the NMOS transistor M21 is performed with the heat-sensitive element 5.

The current detection signal Vsense is output from the connection node of the resistor Rs and the heat-sensitive element 5. A thermistor, diode, or MOS transistor is employed as the heat-sensitive element 5.

FIG. 3 is a diagram showing an overcurrent protection circuit disclosed in Japanese Laid-Open Patent Application No. 2002-26707.

As shown in FIG. 3, in this overcurrent protection circuit, a series circuit of an NMOS transistor M32 and the resistor Rs is connected in parallel to an NMOS transistor M31, so that the current flowing through a load element 20 branches into a current Id1 and a current Id2. The gates of the NMOS transistors M31 and M32 are connected to a gate drive circuit 50.

In FIG. 3, a series circuit of diodes 32 is a first constant voltage power supply having temperature dependence, and Vref1 denotes a second constant voltage power supply having very little temperature dependence. The voltage difference between the first and second constant voltage power supplies is amplified in an operational amplifier circuit 31 to generate a temperature-dependent reference voltage, and the generated reference voltage is applied to one input of a comparator 34.

The current detection signal Vsense, which is the voltage drop across the resistor Rs, is applied to the other input of the comparator 34. The NMOS transistors M31 and M32 and the series circuit of multiple diodes 32 are integrated onto a same semiconductor substrate 30. The output of the comparator 34 is input to the gate drive circuit 50.

According to the above-described configuration, this overcurrent protection circuit compensates for the temperature characteristics of the ON-resistances of the NMOS transistors M31 and M32 with the temperature characteristics of the first constant voltage power supply 32 formed of diodes.

In the case of detecting a detection current that changes with temperature by converting the detection current into voltage with a resistor having little temperature dependence, the detection signal has temperature dependence. Therefore, in the above-described conventional techniques, a component having opposite temperature characteristics (a heat-sensitive element such as a diode, thermistor, or MOS transistor) is added in order to compensate for the temperature dependence.

However, according to the above-described conventional techniques, a device used in the current detector circuit (an NMOS transistor in the above-described conventional techniques) and an element used for temperature compensation (a heat-sensitive element such as a diode, thermistor, or MOS transistor) are different, thus causing a problem in that complete temperature compensation cannot be performed.

SUMMARY

In an aspect of this disclosure, chore are provided a current detector circuit that has very little temperature dependence, and a current-mode DC-DC converter using the same.

In another aspect of this disclosure, there are provided a current detector circuit that performs current detection using a element for current restoration having the same temperature characteristics as a element for current detection, and a current-mode DC-DC converter in which the current detector circuit is used for inductor current detection.

In another aspect of this disclosure, there is provided a current detector circuit detecting a load current flowing through a load, the current detector circuit including a first series circuit having a first element and the load connected in series; a second series circuit having a second element and a resistor connected in series, the second element having a temperature characteristic equal to the temperature characteristic of the resistance of the first element; a power supply configured to supply voltage to the first series circuit and the second series circuit; and a control circuit configured to control the voltage drop across the second element so that the voltage drop across the second element is equal to the voltage drop across the first element, wherein a current detection signal corresponding to the load current is generated based on a current flowing through the second element.

According to one aspect of this current detector circuit, the temperature characteristics of the first element can be canceled out by the second element having the same temperature characteristics, so that it is possible to eliminate temperature dependence.

In another aspect of this disclosure, there is provided a current detector circuit detecting a load current flowing through a load, the current detector circuit including a first series circuit having a first element and the load connected in series; a second series circuit having a second element and a resistor connected in series, the second element having a temperature characteristic equal to the temperature characteristic of the resistance of the first element; a third series circuit connected in parallel to the first element, the third series circuit having a third element and a fourth element connected in series, the third element and the fourth element each having a temperature characteristic equal to the temperature characteristic of the resistance of the first element; a power supply configured to supply voltage to the first series circuit, the second series circuit, and the third series circuit; and a control circuit configured to control the voltage drop across the second element so that the voltage drop across the second element is equal to the voltage drop across one of the third element and the fourth element, wherein a current detection signal corresponding to the load current is generated based on a current flowing through the second element.

According to one aspect of this current detector circuit, the temperature characteristics of the first element can be canceled out by the second element having the same temperature characteristics, so that it is possible to eliminate temperature dependence.

In another aspect of this disclosure, there is provided a current detector circuit detecting a load current flowing through a load, the current detector circuit including a first series circuit having a first element and the load connected in series; a second series circuit having a second element and a constant current source connected in series, the second element having a temperature characteristic equal to the temperature characteristic of the resistance of the first element, the constant current source being configured to supply a limit current; a power supply configured to supply voltage to the first series circuit and the second series circuit; and a control circuit configured to control the voltage drop across the second element so that the voltage drop across the second element is equal to the voltage drop across the first element, wherein a limit signal is output from an end of the constant current source in response to the voltage drop across the first element being greater than the voltage drop across the second element.

According to one aspect of this current detector circuit, the constant current source supplying the limit current to the second element is provided, so that the limit signal having no temperature dependence can be output from one end of the constant current source when the voltage drop across the first element is greater than the voltage drop across the second element.

In another aspect of this disclosure, there is provided a current detector circuit detecting a load current flowing through a load, the current detector circuit including a first series circuit having a first element and the load connected in series; a second series circuit having a second element and a constant current source connected in series, the second element having a temperature characteristic equal to the temperature characteristic of the resistance of the first element, the constant current source being configured to supply a limit current; a third series circuit connected in parallel to the first element, the third series circuit having a third element and a fourth element connected in series, the third element and the fourth element each having a temperature characteristic equal to the temperature characteristic of the resistance of the first element; a power supply configured to supply voltage to the first series circuit, the second series circuit, and the third series circuit; and a control circuit configured to control the voltage drop across the second element so that the voltage drop across the second element is equal to the voltage drop across one of the third element and the fourth element, wherein a limit signal is output from an end of the constant current source in response to the voltage drop across the one of the third element and the fourth element being greater than the voltage drop across the second element.

According to one aspect of this current detector circuit, the constant current source supplying the limit current to the second element is provided, so that the limit signal having no temperature dependence can be output from one end or the constant current source when the voltage drop across one of the third element and the fourth element is greater than the voltage drop across the second element.

In another aspect of this disclosure, there is provided a current-mode DC-DC converter including any of the above-described current detector circuits, wherein the current detector circuit is configured to detect the inductor current of the current-mode DC-DC converter.

It is thus possible to achieve a current-mode DC-DC converter having excellent temperature stability.

In another aspect of this disclosure, there is provided a current detector circuit detecting a limit current of a load current, the current detector circuit including a first MOS transistor through which the load current flows; a second MOS transistor having a temperature characteristic equal to the temperature characteristic of the resistance of the first MOS transistor; a third MOS transistor and a fourth MOS transistor each having a temperature characteristic equal to the temperature characteristic of the resistance of the first MOS transistor, the third MOS transistor and the fourth MOS transistor being connected in series so that the series connection is connected in parallel to the first MOS transistor; a constant current source configured to supply the limit current to the second MOS transistor; and a comparator circuit configured to compare the voltage drop across the second MOS transistor and the voltage drop across one of the third MOS transistor and the fourth MOS transistor, wherein a limit signal is output from the output of the comparator circuit in response to the voltage drop across the one of the third MOS transistor and the fourth MOS transistor being greater than the voltage drop across the second MOS transistor.

According to one aspect of this current detector circuit, it is possible to cancel temperature characteristics, so that it is possible to eliminate temperature dependence.

Thus, current detection is performed using a element for current restoration having the same temperature characteristics as a element for current detection. Accordingly, it is possible to completely cancel the temperature dependence of the element for current detection, so that it is possible to perform current detection with high accuracy.

Further, since the above current detector circuit is used to detect a limit current, it is possible to detect the limit current with high accuracy.

Further, since the above highly accurate current detector circuit is used to detect the inductor current of a current-mode DC-DC converter, it is possible to achieve a current-mode DC-DC converter having excellent temperature stability.

BRIEF DESCRIPTION OF THE DRAWINGS

The above-mentioned and other aspects, features and advantages will become more apparent from the following detailed description when read in conjunction with the accompanying drawings, in which.

DETAILED DESCRIPTION OF THE PREFERRED EMBODIMENTS

A description is given below, with reference to the accompanying drawings, of the present invention.

First Embodiment

Figure 1:
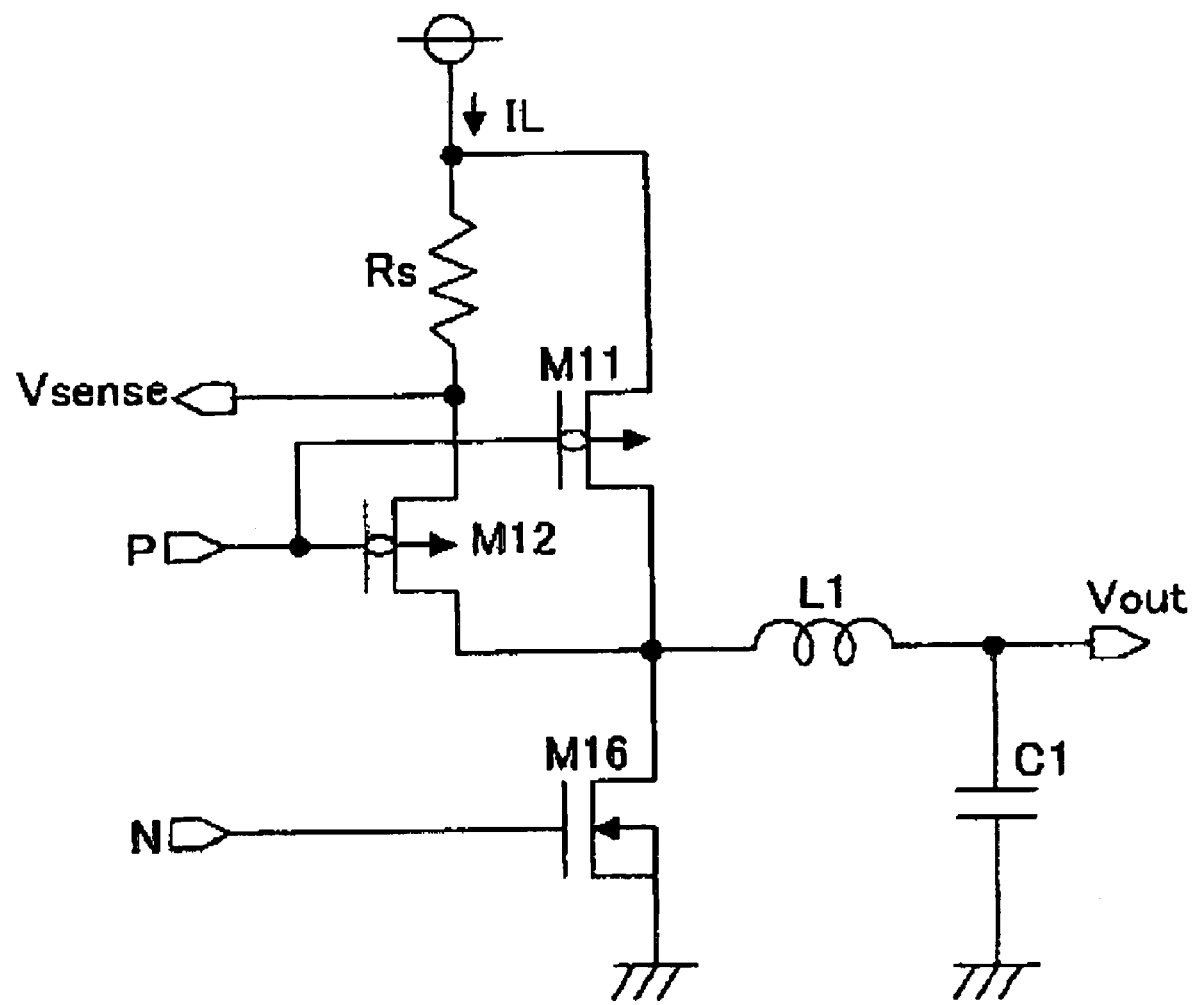
FIG. 1 is a diagram showing a conventional current detector circuit that detects a current flowing through a switching device of a DC-DC converter.
Figure 2:
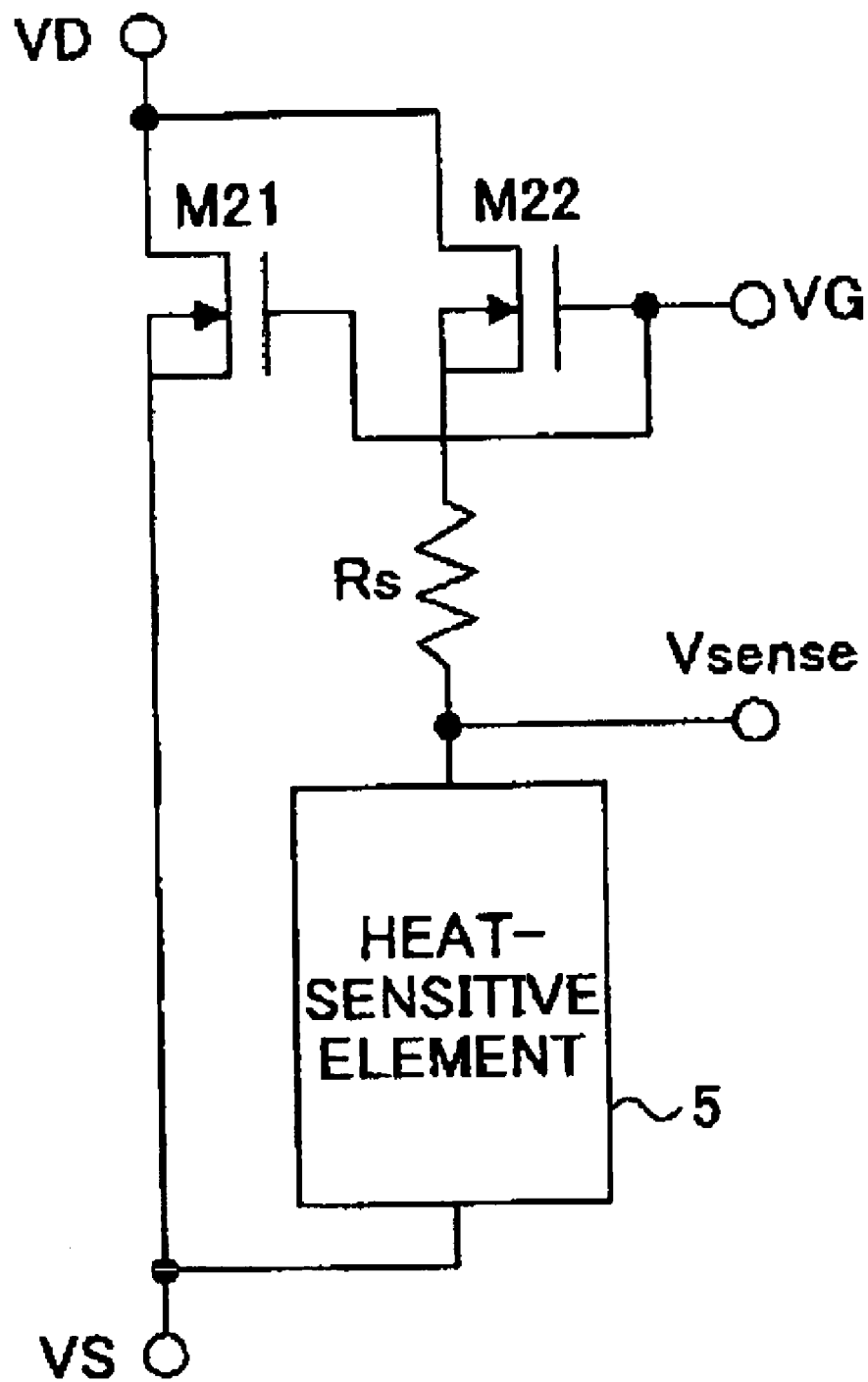
FIG. 2 is a diagram showing a conventional current detector circuit.
Figure 3:
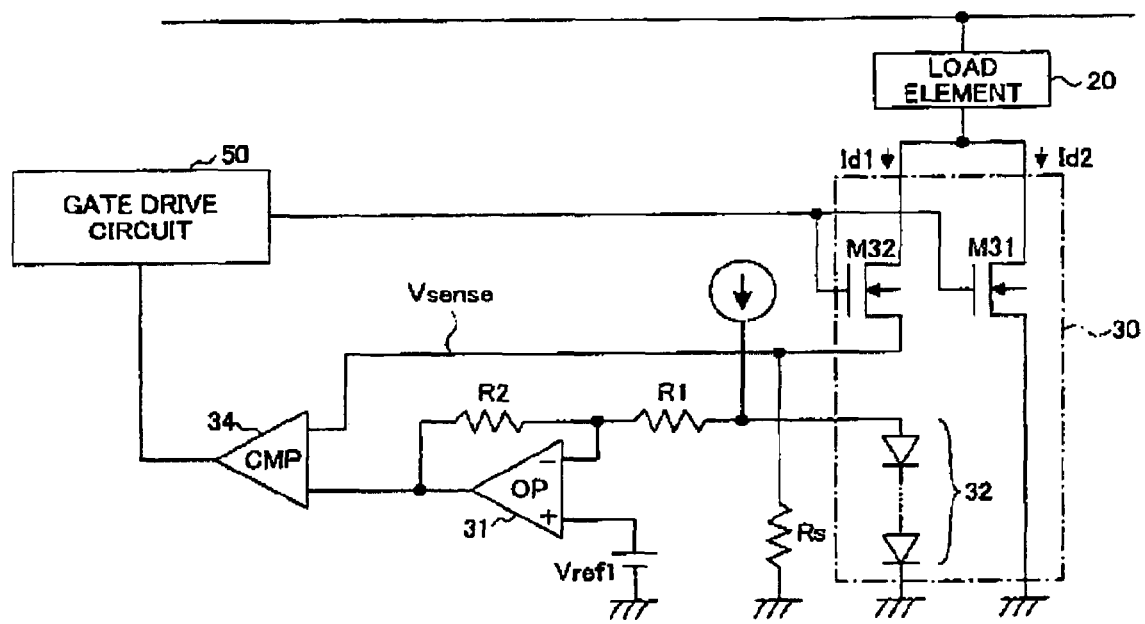
FIG. 3 is a diagram showing a conventional current detector circuit that outputs a limit signal.
Figure 4:
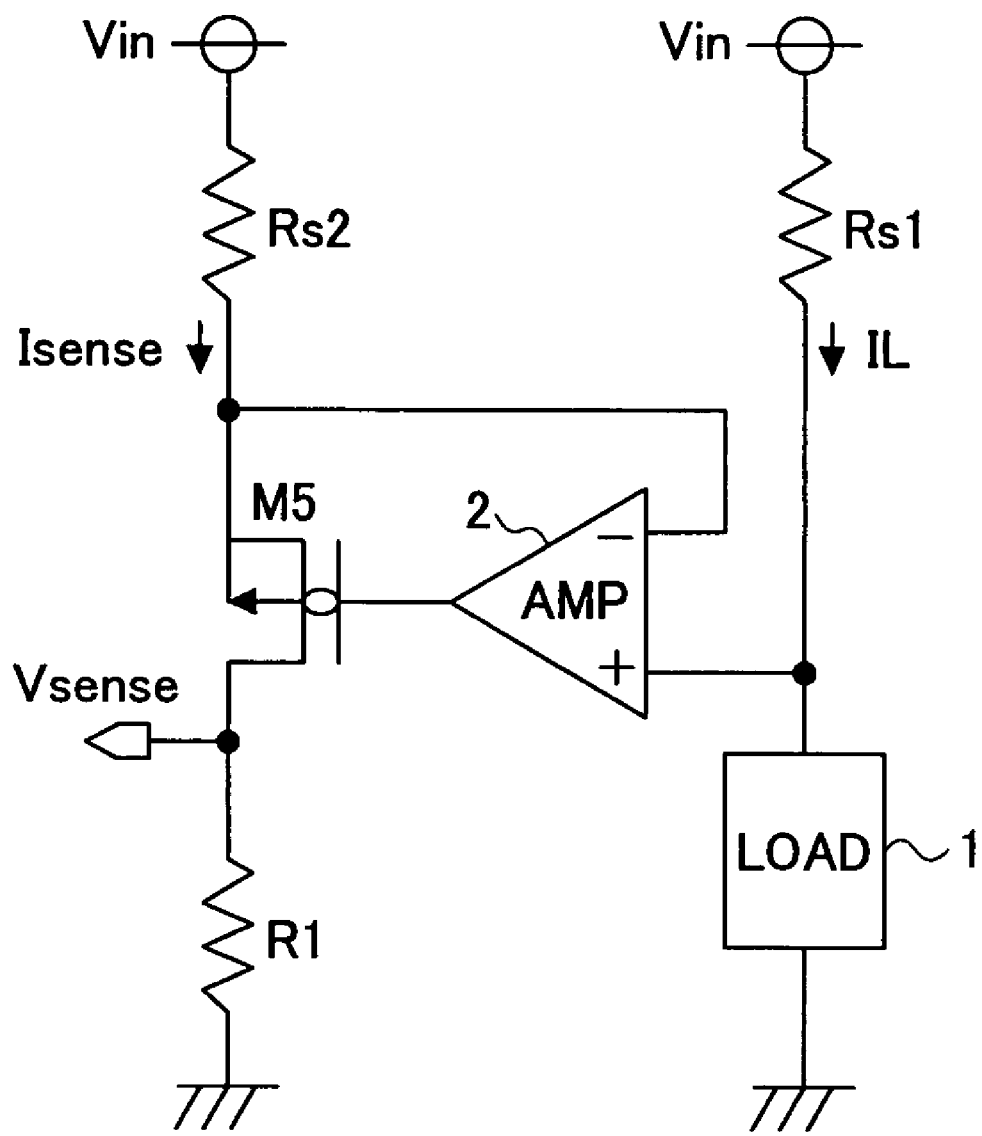
FIG. 4 is a diagram showing a current detector circuit according to a first embodiment of the present invention.

FIG. 4 is a diagram showing a current detector circuit according to a first embodiment of the present invention.

Referring to FIG. 4, the current detector circuit according to this embodiment includes a first element having a resistance Rs1, a second element having a resistance Rs2, an operational amplifier circuit 2, a PMOS transistor M5, a resistor R1, and a load 1. A power supply (supply voltage) Vin is applied to the current detector circuit.

The first element having the resistance Rs1 is connected in series to the load 1, and is connected between the power supply Vin and ground. The connection node of the first element having the resistance Rs1 and the load 1 is connected to the non-inverting input or the operational amplifier circuit 2. It is possible to provide the first element having the resistance Rs1 and the second element having the resistance Rs2 with the same temperature characteristics by manufacturing the first element having the resistance Rs1 and the second element having the resistance Rs2 on the same semiconductor substrate by the same process.

The second element having the resistance Rs2, the PMOS transistor M5, and the resistor R1 are connected in series between the power supply Vin and ground. The connection node of the second element having the resistance Rs2 and the PMOS transistor M5, that is, the source of the PMOS transistor M5, is connected to the inverting input or the operational amplifier circuit 2.

The output of the operational amplifier 2 is connected to the gate of the PMOS transistor M5. The voltage drop across the second element having the resistance Rs2 is controlled so as to be equal to the voltage drop across the first element having the resistance Rs1 by the operational amplifier circuit 2 and the PMOS transistor M5.

The drain of the PMOS transistor M5 is grounded through the resistor R1, so that a current detection signal Vsense is converted into voltage by the resistor R1 to be output from the drain of the PMOS transistor M5.

Next, the current detection signal Vsense in the case of letting a load current flowing through the load 1 be IL is determined. Here, it is assumed that the first element having the resistance Rs1 and the second element having the resistance Rs2 have the same temperature characteristics and a temperature coefficient γ, the resistor R1 has a temperature coefficient of 0, Δt is a change in temperature, and Isense is a detection current flowing through the second element having the resistance Rs2.

Since the voltage drop across the second element having the resistance Rs2 is controlled so as to be equal to the voltage drop across the first element having the resistance Rs1 by the operational amplifier circuit 2 and the PMOS transistor M5 as described above, the detection current Isense is given by:

$$Isense = IL \cdot Rs1(1+\Delta t \cdot \gamma)/Rs2(1+\Delta t \cdot \gamma), \quad (4)$$

Dividing each of the numerator and the denominator of Eq. (4) by $(1+\Delta t \cdot \gamma)$, the detection current Isense is given by:

$$Isense = IL \cdot Rs1/Rs2. \quad (5)$$

This shows that the detection current Isense has no temperature characteristics.

Since this detection current Isense is converted into voltage using the resistor R1 whose temperature coefficient is 0, the current detection signal Vsense is given by:

$$Vsense = R1 \cdot IL \cdot Rs1/Rs2 = R1 \cdot Isense. \quad (6)$$

This shows that the current detections signal Vsense has no temperature characteristics, either.

Second Embodiment

Figure 5:
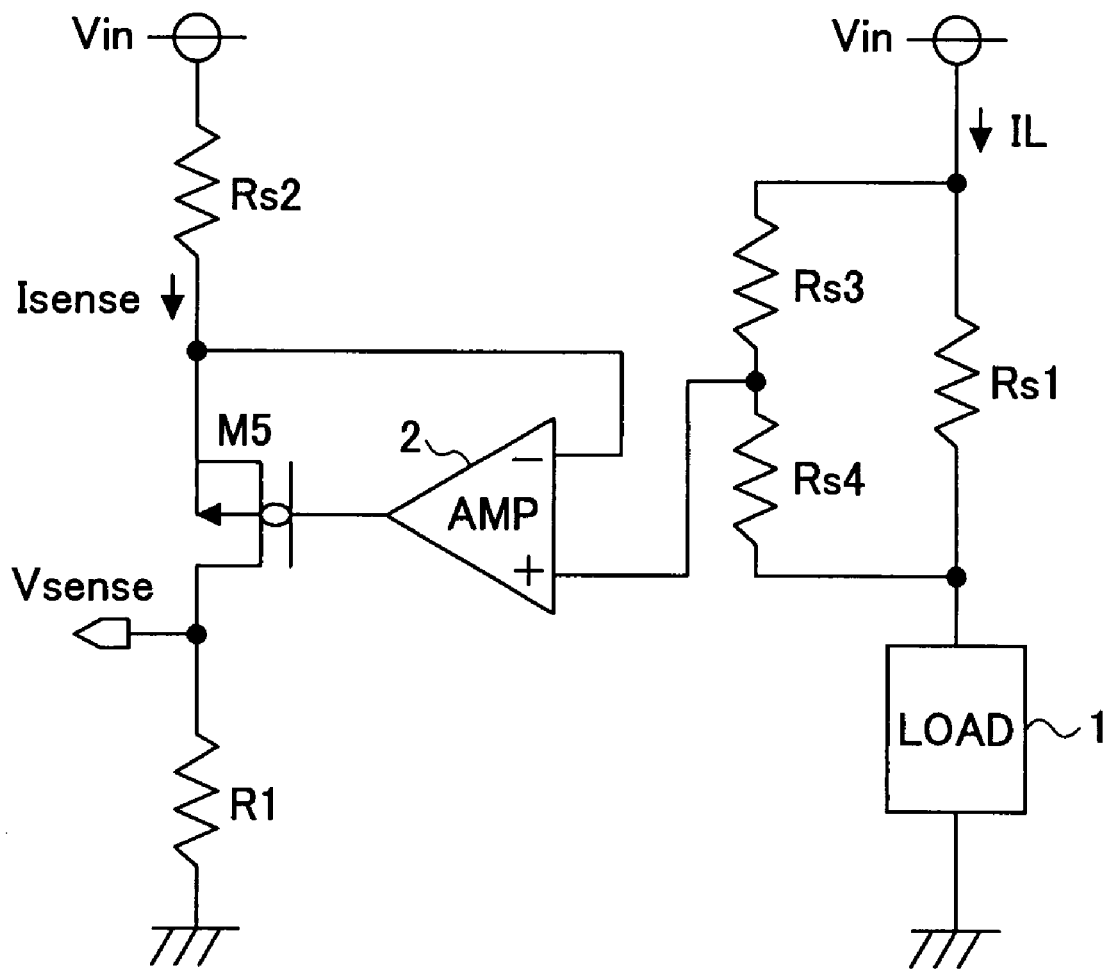
FIG. 5 is a diagram showing a current detector circuit according to a second embodiment of the present invention.

FIG. 5 is a diagram showing a current detector circuit according to a second embodiment of the present invention.

Referring to FIG. 5, in the current detector circuit according to this embodiment, a series circuit of a third element having a resistance Rs3 and a fourth element having a resistance Rs4 is connected in parallel to the first element having the resistance Rs1 of the current detector circuit shown in the first embodiment (FIG. 4), and the connection node of the third element having the resistance Rs3 and the fourth element having the resistance Rs4 is connected to the non-inverting input of the operational amplifier 2. The temperature characteristics of the resistances of the third element having the resistance Rs3 and the fourth element having the resistance Rs4 are the same as those of the resistance of the first element having the resistance Rs1. It is possible to provide the first through fourth elements having the resistances Rs1 through Rs4 with the same temperature characteristics by manufacturing the first through fourth elements having the resistances Rs1 through Rs4 on the same semiconductor substrate by the same process.

Next, the current detection signal Vsense in this current detector circuit is determined. The reference numerals or marks are the same as in the case of FIG. 4 except that the temperature-dependent part is simplified as $\alpha=(1+\Delta t \cdot \gamma)$. First, the detection current Isense is given by:

$$I\text{sense} = IL \cdot Rs1 \cdot Rs3 \cdot \alpha^2 / Rs2 \cdot \alpha^2 (Rs1 + Rs3 + Rs4). \tag{7}$$

Dividing each of the numerator and the denominator of Eq. (7) by $\alpha^2$, the detection current Isense is given by:

$$I\text{sense} = IL \cdot Rs1 \cdot Rs3 / Rs2 (Rs1 + Rs3 + Rs4) \tag{8}$$

This shows that the detection current Isense has no temperature characteristics.

Since this detection current Isense is converted into voltage using the resistor R1 whose temperature coefficient is 0, the current detection signal Vsense is given by:

$$V\text{sense} = R1 \cdot IL \cdot Rs1 \cdot Rs3 / Rs2 (Rs1 + Rs3 + Rs4) = R1 \cdot I\text{sense}. \tag{9}$$

Thus, a voltage having no temperature characteristics is obtained as the current detection signal Vsense.

Third Embodiment

Figure 6:
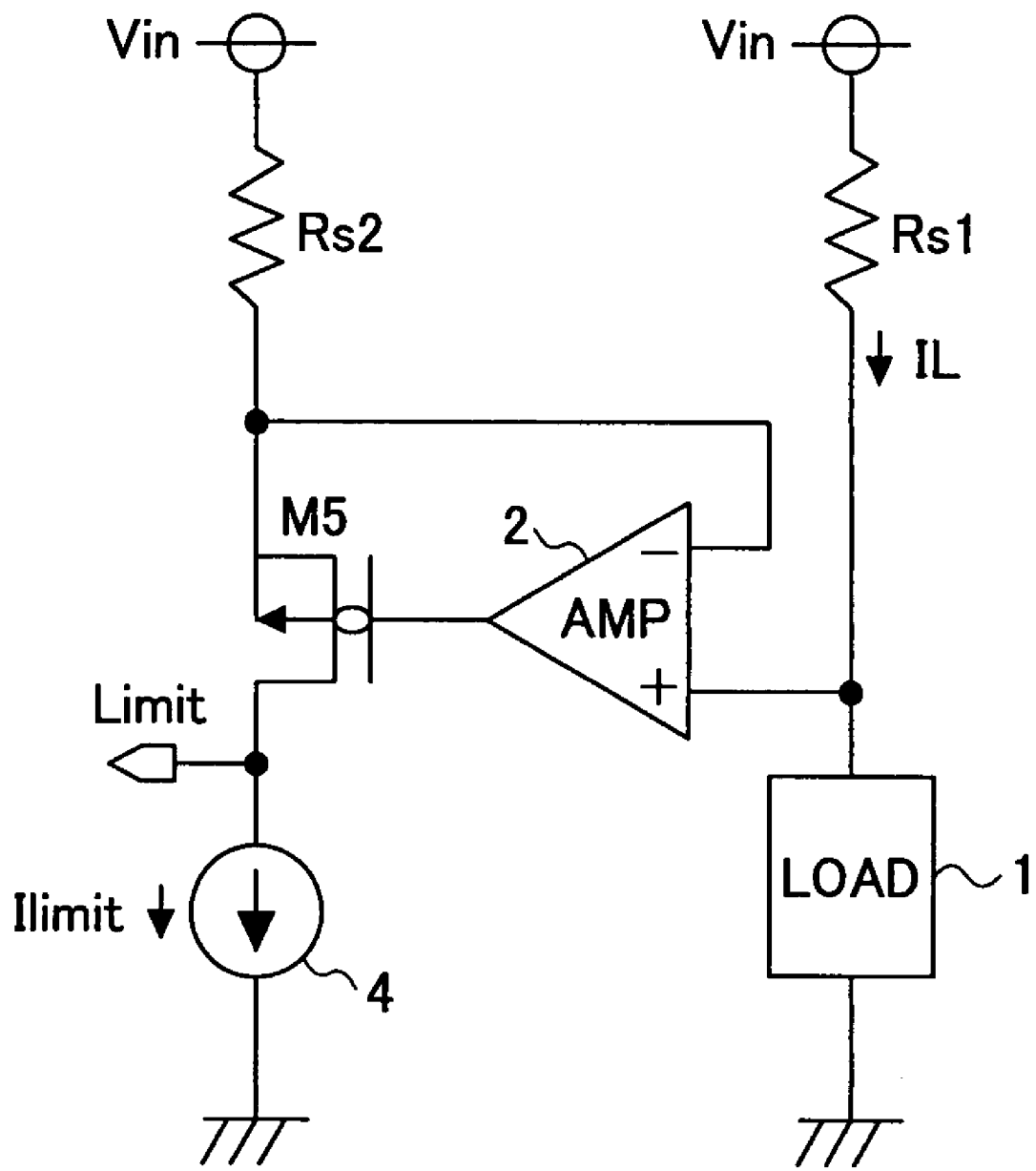
FIG. 6 is a diagram showing a current detector circuit according to a third embodiment of the present invention.

FIG. 6 is a diagram showing a current detector circuit that outputs a limit signal according to a third embodiment of the present invention. The limit signal is used to force control of the ON-cycle signal of a switching power supply.

Referring to FIG. 6, in the current detector circuit according to this embodiment, the resistor R1 of the first embodiment (FIG. 4) is replaced with a constant current source 4. The output current of the constant current source 4 is a predetermined limit current Ilimit.

If the load current IL is small so that the voltage drop across the first element having the resistance Rs1 is less than the voltage drop across the second element having the resistance Rs2 in the case of the limit current Ilimit flowing through the second element having the resistance Rs2, the current flowing through the second element having the resistance Rs2 is caused to be less than the limit current Ilimit because the voltage drop across the second element having the resistance Rs2 is controlled so as to be equal to the voltage drop across the first element having the resistance Rs1 through the operations of the operational amplifier circuit 2 and the PMOS transistor M5. Accordingly, the limit signal Limit becomes LOW (low level).

When the load current IL increases so that the voltage drop across the first element having the resistance Rs1 is greater than the voltage drop across the second element having the resistance Rs2 in the case of the limit current Ilimit flowing through the second element having the resistance Rs2, the output of the operational amplifier circuit 2 becomes LOW (low level) so as to turn ON the PMOS transistor M5. As a result, the limit signal Limit becomes HIGH (high level).

Since the voltage drop across the first element having the resistance Rs1 is IL·Rs1 and the voltage drop across the second element having the resistance Rs2 in the case of the limit current Ilimit flowing through the second element having the resistance Rs2 is Ilimit·Rs2, a load current (limit detection current) limit in the case of both voltage drops matching each other is given by:

$$I\text{Limit} = I\text{limit} \cdot Rs2(1+\Delta t \cdot \gamma)/Rs1(1+\Delta t \cdot \gamma) \tag{10}$$

Dividing each of the numerator and the denominator of Eq. (10) by $(1+\Delta t \cdot \gamma)$, ILimit is given by:

$$I\text{Limit} = I\text{limit} \cdot Rs2 / Rs1, \tag{11}$$

showing that the limit detection current ILimit has no temperature dependence.

Fourth Embodiment

Figure 7:
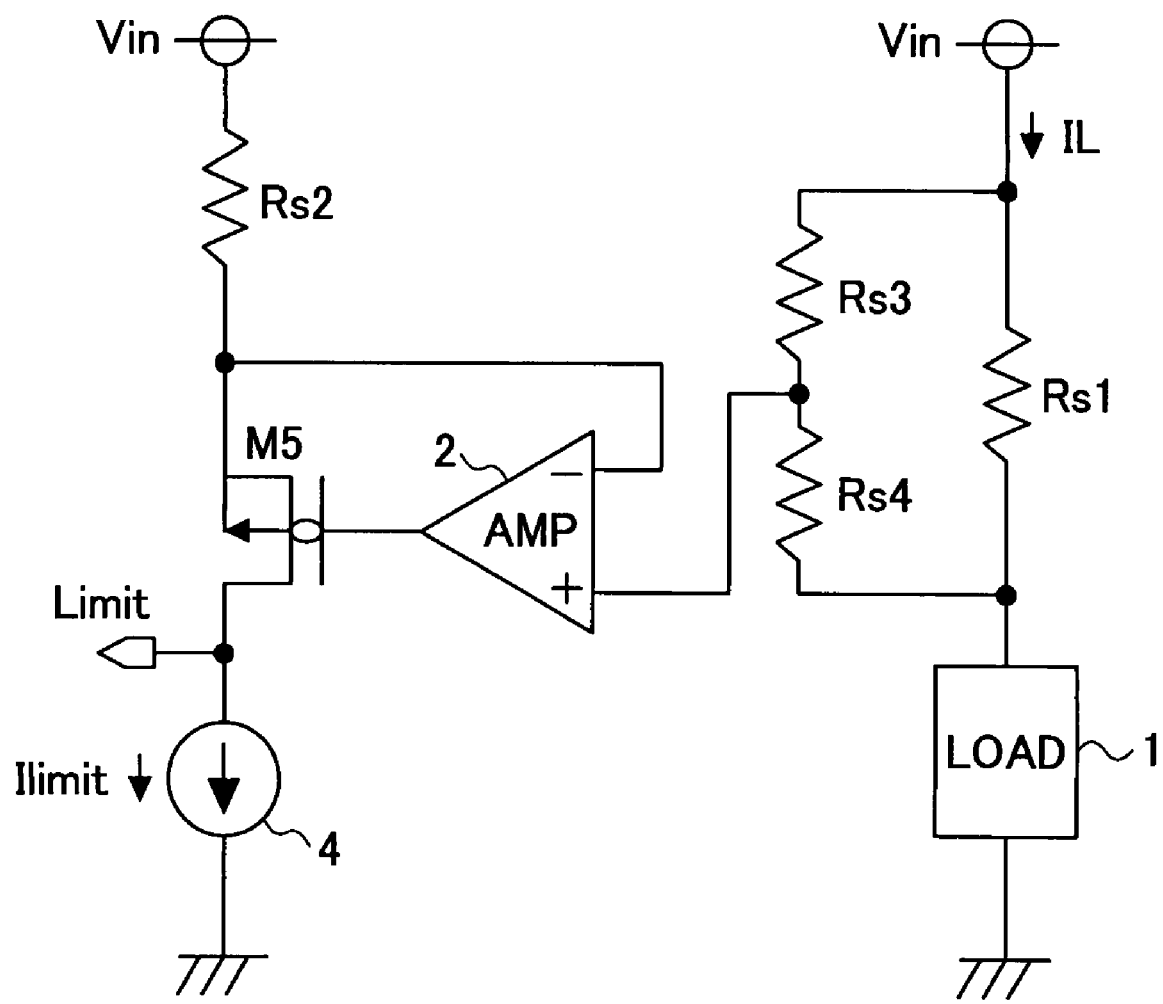
FIG. 7 is a diagram showing a current detector circuit according to a fourth embodiment of the present invention.

FIG. 7 is a diagram showing a current detector circuit that outputs a limit signal according to a fourth embodiment of the present invention.

Referring to FIG. 7, in the current detector circuit according to this embodiment, the resistor R1 of the second embodiment (FIG. 5) is replaced with the constant current source 4. The output current of the constant current source 4 is the predetermined limit current Ilimit.

If the load current IL is small so that the voltage drop across the third element having the resistance Rs3 is less than the voltage drop across the second element having the resistance Rs2 in the case of the limit current limit flowing through the second element having the resistance Rs2, the current flowing through the second element having the resistance Rs2 is caused to be less than the limit current Ilimit because the voltage drop across the second element having the resistance Rs2 is controlled so as to be equal to the voltage drop across the third element having the resistance Rs3 through the operations of the operational amplifier circuit 2 and the PMOS transistor M5. Accordingly, the limit signal Limit becomes LOW.

When the load current IL increases so that the voltage drop across the third element having the resistance Rs3 is greater than the voltage drop across the second element having the resistance Rs2 in the case of the limit current limit flowing through the second element having the resistance Rs2, the output of the operational amplifier circuit 2 becomes LOW so as to turn ON the PMOS transistor M5. As a result, the limit signal Limit becomes HIGH.

The load current (limit detection current) ILimit in the case of the voltage drop across the third element having the resistance Rs3 and the voltage drop across the second element having the resistance Rs2 in the case of the limit current Ilimit flowing through the second element having the resistance Rs2 matching each other is given by:

$$I\text{Limit} = I\text{limit} \cdot Rs2(Rs1+Rs3+Rs4) \cdot \alpha^2 / Rs1 \cdot Rs3 \cdot \alpha^2, \tag{12}$$

where $\alpha = (1+\Delta t \cdot \gamma)$.

Dividing each of the numerator and the denominator of Eq. (12) by $\alpha^2$, ILimit is given by:

$$I\text{Limit} = I\text{limit} \cdot Rs2(Rs1+Rs3+Rs4)/Rs1 \cdot Rs3, \tag{13}$$

showing that the limit detection current ILimit has no temperature dependence.

In the switching power supply, it is common to perform such control as to force PWM-controlled switching to be OFF using a detected limit signal. The limit signal Limit according to the present invention is also used to force control of the ON-cycle signal of the switching power supply.

Fifth Embodiment

Figure 8:
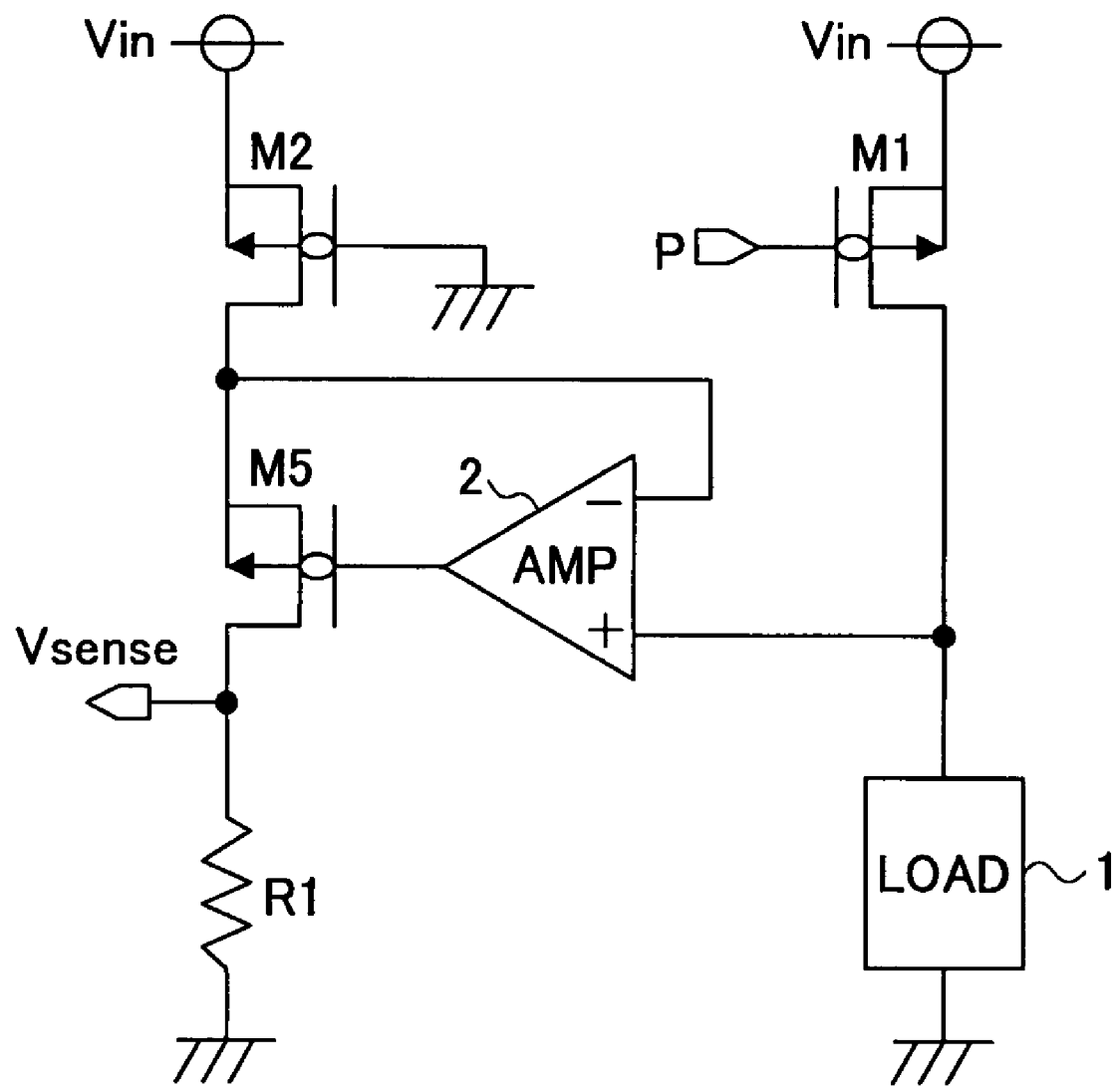
FIG. 8 is a diagram showing a current detector circuit according to a fifth embodiment of the present invention.

FIG. 8 is a diagram showing a current detector circuit according to a fifth embodiment of the present invention.

Referring to FIG. 8, in the current detector circuit according to this embodiment, the first element having the resistance Rs1 and the second element having the resistance Rs2 of the first embodiment (FIG. 4) are replaced with a PMOS transistor M1 and a PMOS transistor M2, respectively.

The PMOS transistor M1 is controlled to turn ON and OFF based on a control signal P applied to the gate thereof. The gate of the PMOS transistor M2 is grounded so that the PMOS transistor M2 is constantly ON. Since the PMOS transistor M1 and the PMOS transistor M2 are manufactured on the same semiconductor substrate by the same process, the ON-resistances of the PMOS transistor M1 and the PMOS transistor M2 have the same temperature characteristics. As a result, the current detection signal Vsense is a voltage having no temperature dependence as described in the first embodiment (FIG. 4).

In this embodiment, the gate of the PMOS transistor M2 is grounded. Alternatively, the gate of the PMOS transistor M2 and the gate of the PMOS transistor M1 may be connected so that the PMOS transistor M2 may be turned ON and OFF in synchronization with the PMOS transistor M1 based on the control signal P because the PMOS transistor M2 may have only to be ON when the PMOS transistor M1 is ON.

Sixth Embodiment

Figure 9:
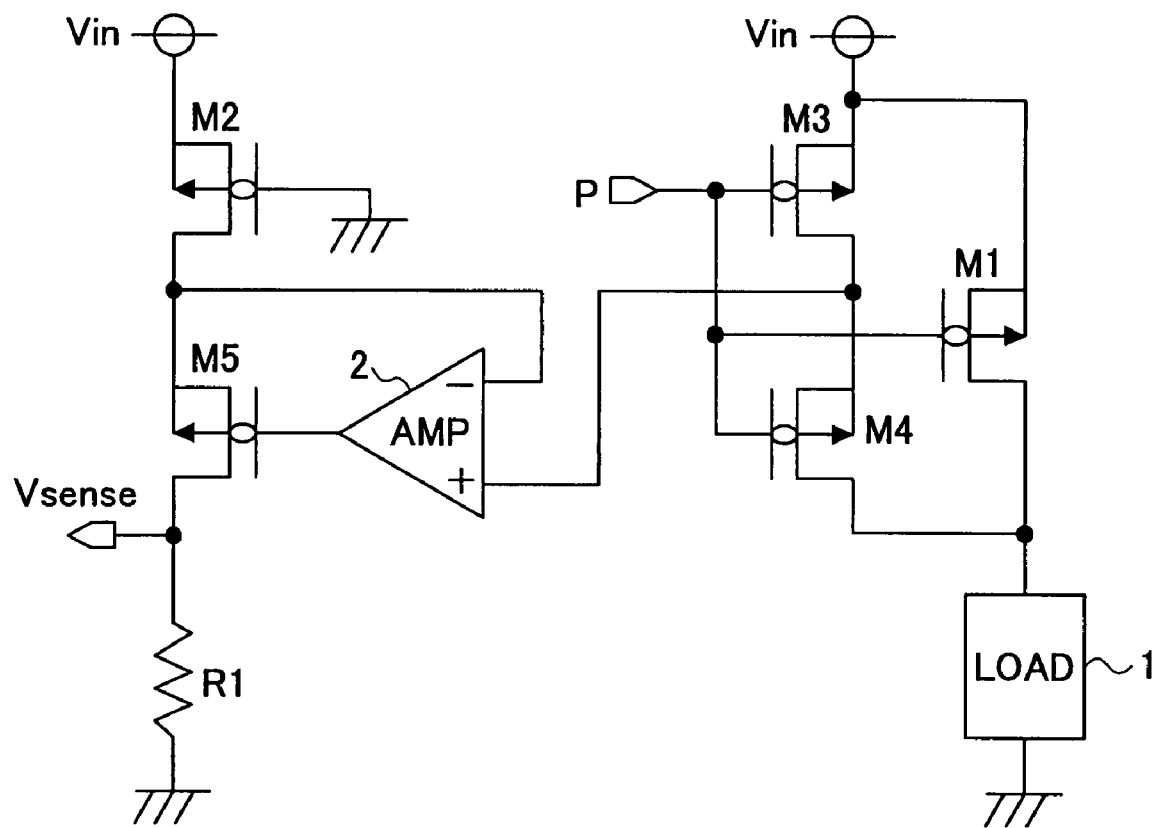
FIG. 9 is a diagram showing a current detector circuit according to a sixth embodiment of the present invention.

FIG. 9 is a diagram showing a current detector circuit according to a sixth embodiment of the present invention.

Referring to FIG. 9, in the current detector circuit according to this embodiment, the first, second, third, and fourth elements having the resistances Rs1, Rs2, Rs3, and Rs4 of the second embodiment (FIG. 5) are replaced with the PMOS transistor M1, the PMOS transistor M2, a PMOS transistor M3, and a PMOS transistor M4, respectively.

The gates of the PMOS transistors M1, M3, and M4 are connected in common so that the PMOS transistors M1, M3, and M4 are simultaneously turned ON and OFF based on a control signal P applied to the gates thereof. The gate of the PMOS transistor M2 is grounded so that the PMOS transistor M2 is constantly ON.

Since the PMOS transistors M1 through M4 are manufactured on the same semiconductor substrate by the same process, their ON-resistances have the same temperature characteristics. As a result, the current detection signal Vsense is a voltage having no temperature dependence as described in the second embodiment (FIG. 5).

In this embodiment, the gate of the PMOS transistor M2 is grounded. Alternatively, the gate of the PMOS transistor M2 and the gate of the PMOS transistor M1 may be connected as described in the fifth embodiment (FIG. 8).

Seventh Embodiment

Figure 10:
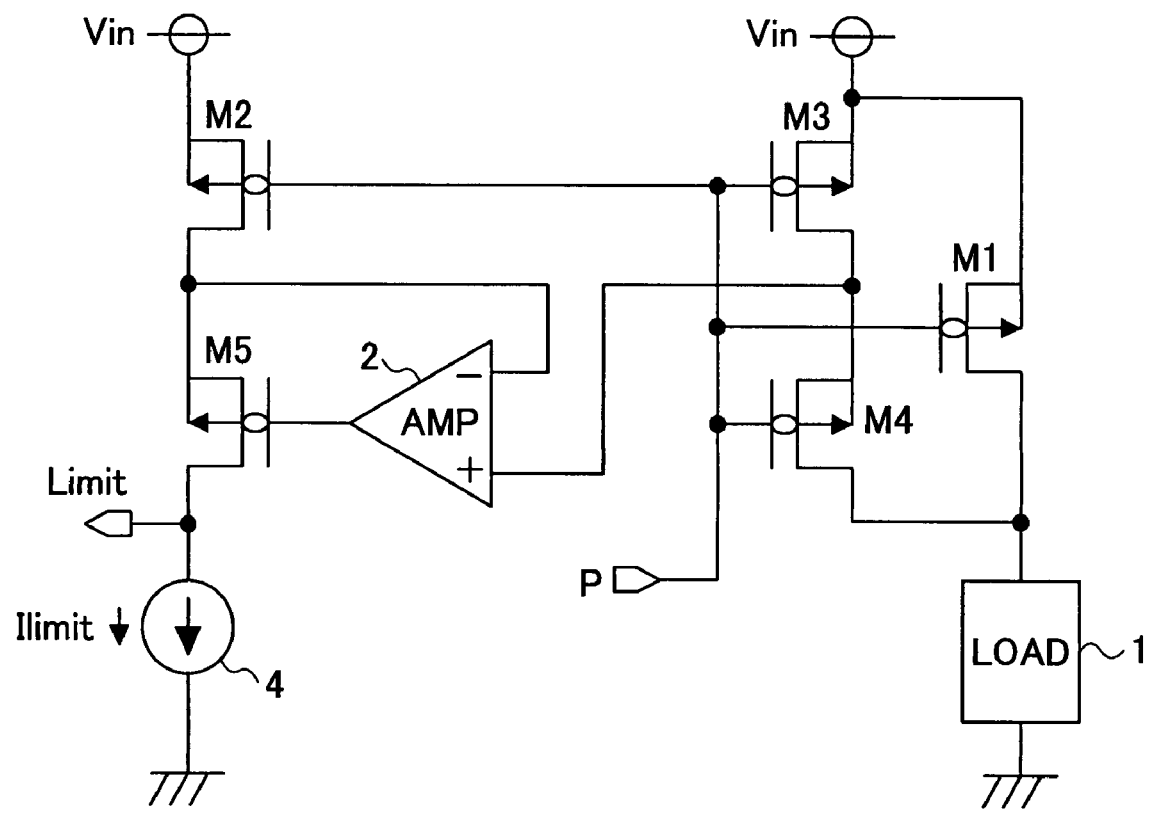
FIG. 10 is a diagram showing a current detector circuit according to a seventh embodiment of the present invention.

FIG. 10 is a diagram showing a current detector circuit that outputs a limit signal according to a seventh embodiment of the present invention.

Referring to FIG. 10, in the current detector circuit according to this embodiment, the first through fourth elements having the resistances Rs1 through Rs4 of the fourth embodiment (FIG. 7) are replaced with the PMOS transistors M1 through M4, respectively.

The gates of the PMOS transistors M1 through M4 are connected in common so that the PMOS transistors M1 through M4 are simultaneously turned ON and OFF based on the control signal P applied to the gates thereof. Since the PMOS transistors M1 through M4 are manufactured on the same semiconductor substrate by the same process, their ON-resistances have the same temperature characteristics. As a result, the current detection signal Vsense is a voltage having no temperature dependence as described in the second embodiment (FIG. 5).

In this embodiment, the gate of the PMOS transistor M2 and the gate of the PMOS transistor M1 are connected in common. Alternatively, the gate of the PMOS transistor M2 may be grounded as described in the fifth embodiment (FIG. 8) or the sixth embodiment (FIG. 9).

Eighth Embodiment

Figure 11:
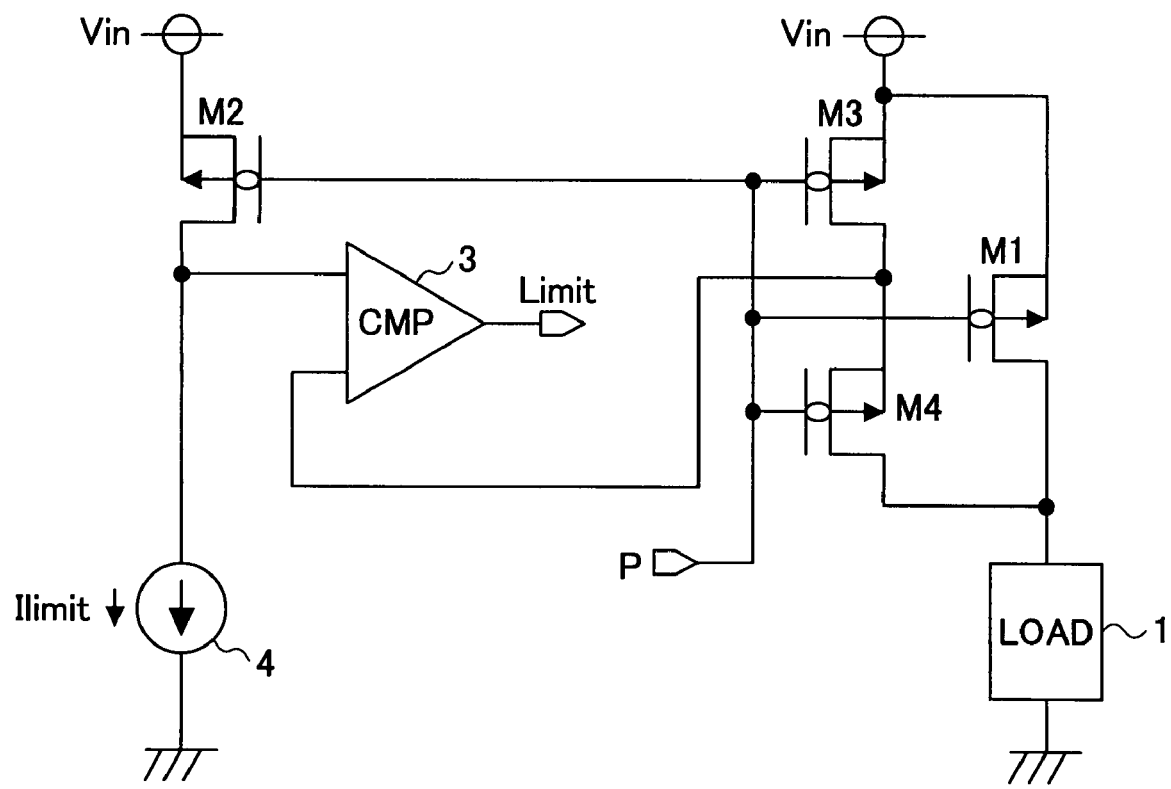
FIG. 11 is a diagram showing a current detector circuit according to an eighth embodiment of the present invention.

FIG. 11 is a diagram showing a current detector circuit that outputs a limit signal according to an eighth embodiment of the present invention.

The current detector circuit according to this embodiment is different from the current detector circuit of the seventh embodiment (FIG. 10) in that instead of controlling the voltage drop across the PMOS transistor M2, the constant current source 4 is connected to the drain of the PMOS transistor M2, and a comparator 3 that compares the voltage at the drain of the PMOS transistor M2 and the voltage at the drain of the PMOS transistor M3 is provided.

If the voltage drop across the PMOS transistor M3 is greater than the voltage drop across the PMOS transistor M2, the comparator 3 reverses to output the limit signal Limit. The value of the load current IL that causes the voltage drop across the PMOS transistor M3 to be greater than the voltage drop across the PMOS transistor M2 is the same as the current shown in Eq. (13).

Ninth Embodiment

Figure 12:
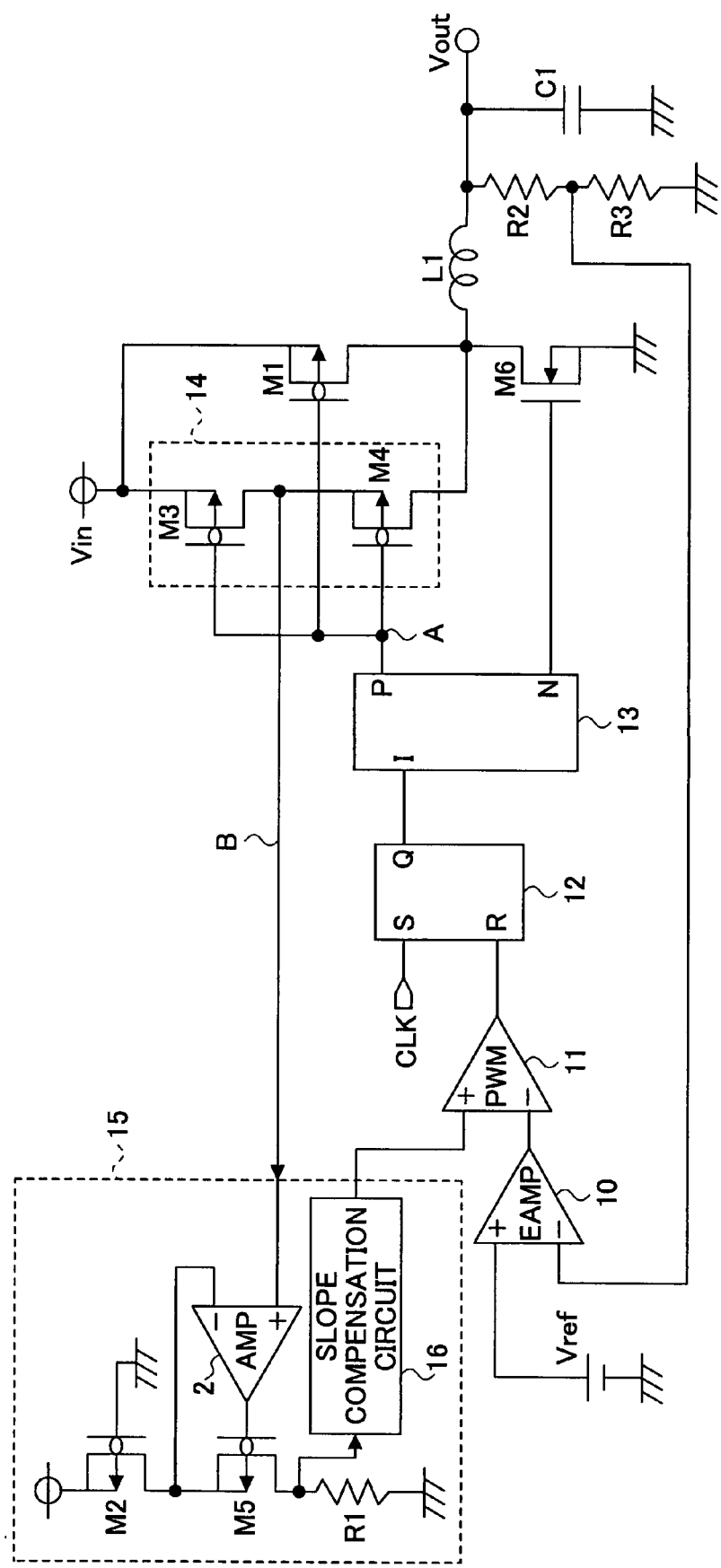
FIG. 12 is a diagram showing a step-down current-mode DC-DC converter according to a ninth embodiment of the present invention, where the current detector circuit shown in the sixth embodiment is applied to a slope forming circuit thereof.

FIG. 12 is a diagram showing a step-down current-mode DC-DC converter according to a ninth embodiment of the present invention, where the current detector circuit shown in the sixth embodiment (FIG. 9) is applied to the slope forming circuit thereof.

Referring to FIG. 12, the PMOS transistors M1, M3, and M4 form the switching device of the DC-DC converter, and detect inductor current. An NMOS transistor M6 is a device for synchronous rectification. A voltage B at the connection node of the PMOS transistors M3 and M4, which transistors form a PMOS transistor series circuit 14, is input to a slope forming circuit 15.

The slope forming circuit 15 includes the operational amplifier circuit 2, the PMOS transistors M2 and M5, the resistor R1, and a slope compensation circuit 16. The operational amplifier circuit 2, the PMOS transistors M2 and M5, and the resistor R1 are combined with the PMOS transistors M1, M3, and M4 into the same current detector circuit as that of the sixth embodiment (FIG. 9).

The voltage output from the connection node of the PMOS transistor M5 and the resistor R1, which voltage has no temperature dependence and is proportional to the inductor current (corresponding to the current detection signal Vsense of the sixth embodiment shown in FIG. 9), is input to the slope compensation circuit 16. The output of the slope compensation circuit 16 is applied to the non-inverting input of a PWM comparator 11.

The output of an error amplifier circuit 10 is applied to the inverting input of the PWM comparator 11. A reference voltage Vref is applied to the non-inverting input of the error amplifier circuit 10, and a voltage obtained by dividing the output voltage Vout with resistors R2 and R3 is applied to the inverting input of the error amplifier circuit 10.

A clock signal is applied to the set (S) input of a flip-flop 12, and the output of the PWM comparator 11 is applied to the reset (R) input of the flip-flop 12. The output Q of the flip-flop 12 is applied to the input of a gate control circuit 13.

The gate control circuit 13 outputs complementary signals P and N. The output P is applied to the gates of the PMOS transistors M1, M3, and M4 so as to perform on-off control thereof. The output N is applied to the gate of the NMOS transistor M6 so as to perform on-off control thereof.

According to this embodiment, by adopting the configuration of the current detector circuit as described above in the sixth embodiment (FIG. 9) as a current detector circuit in the current-mode DC-DC converter, it is possible to eliminate the temperature dependence of the slope forming circuit 15, so that it is possible to realize a current-mode DC-DC converter having excellent temperature stability.

According to one embodiment of the present invention, there is provided a current detector circuit detecting a load current flowing through a load, the current detector circuit including a first series circuit having a first conductor and the load connected in series; a second series circuit having a second conductor and a resistor connected in series, the second conductor having a temperature characteristic equal to the temperature characteristic of the resistance of the first conductor; a power supply configured to supply voltage to the first series circuit and the second series circuit; and a control circuit configured to control the voltage drop across the second conductor so that the voltage drop across the second conductor is equal to the voltage drop across the first conductor, wherein a current detection signal corresponding to the load current is generated based on a current flowing through the second conductor.

According to one aspect of the present invention, a first current detector circuit that detects a load current may include a first conductor through which the load current flows; a second conductor having the same temperature characteristics as the resistance of the first conductor; a power supply configured to supply current to the second conductor; and a control circuit configured to control the voltage drop across the second conductor so that the voltage drop across the second conductor is the same voltage as the voltage drop across the first conductor, wherein the current that flows through the second conductor may be employed as a current detection signal. Accordingly, the temperature characteristics of the first conductor can be canceled out by the second conductor having the same temperature characteristics, so that it is possible to eliminate temperature dependence.

According to one embodiment of the present invention, there is provided a current detector circuit detecting a load current flowing through a load, the current detector circuit including a first series circuit having a first conductor and the load connected in series; a second series circuit having a second conductor and a resistor connected in series, the second conductor having a temperature characteristic equal to the temperature characteristic of the resistance of the first conductor; a third series circuit connected in parallel to the first conductor, the third series circuit having a third conductor and a fourth conductor connected in series, the third conductor and the fourth conductor each having a temperature characteristic equal to the temperature characteristic of the resistance of the first conductor; a power supply configured to supply voltage to the first series circuit, the second series circuit, and the third series circuit; and a control circuit configured to control the voltage drop across the second conductor so that the voltage drop across the second conductor is equal to the voltage drop across one of the third conductor and the fourth conductor, wherein a current detection signal corresponding to the load current is generated based on a current flowing through the second conductor.

According to one aspect of the present invention, a second current detector circuit detecting a load current may include a first conductor through which the load current flows; a second conductor having the same temperature characteristics as the resistance of the first conductor; a third conductor and a fourth conductor each having the same temperature characteristics as the resistance of the first conductor, the third conductor and the fourth conductor being connected in series so that the series connection is connected in parallel to the first conductor; a power supply configured to supply current to the second conductor; and a control circuit configured to control the voltage drop across the second conductor so that the voltage drop across the second conductor is equal to the voltage drop across one of the third conductor and the fourth conductor, wherein the current that flows through the second conductor may be employed as a current detection signal. Accordingly, the temperature characteristics of the first conductor can be canceled out by the second conductor having the same temperature characteristics, so that it is possible to eliminate temperature dependence.

According to one embodiment of the present invention, there is provided a current detector circuit detecting a load current flowing through a load, the current detector circuit including a first series circuit having a first conductor and the load connected in series; a second series circuit having a second conductor and a constant current source connected in series, the second conductor having a temperature characteristic equal to the temperature characteristic of the resistance of the first conductor, the constant current source being configured to supply a limit current; a power supply configured to supply voltage to the first series circuit and the second series circuit; and a control circuit configured to control the voltage drop across the second conductor so that the voltage drop across the second conductor is equal to the voltage drop across the first conductor, wherein a limit signal is output from an end of the constant current source in response to the voltage drop across the first conductor being greater than the voltage drop across the second conductor.

According to one aspect of the present invention, in order to detect a limit current, the above-described first current detector circuit may include a constant current source supplying the limit current to the second conductor in place of the resistor, so that a limit signal having no temperature dependence can be output from one end of the constant current source when the voltage drop across the first conductor is greater than the voltage drop across the second conductor.

According to one embodiment of the present invention, there is provided a current detector circuit detecting a load current flowing through a load, the current detector circuit including a first series circuit having a first conductor and the load connected in series; a second series circuit having a second conductor and a constant current source connected in series, the second conductor having a temperature characteristic equal to the temperature characteristic of the resistance of the first conductor, the constant current source being configured to supply a limit current; a third series circuit connected in parallel to the first conductor, the third series circuit having a third conductor and a fourth conductor connected in series, the third conductor and the fourth conductor each having a temperature characteristic equal to the temperature characteristic of the resistance of the first conductor; a power supply configured to supply voltage to the first series circuit, the second series circuit, and the third series circuit; and a control circuit configured to control the voltage drop across the second conductor so that the voltage drop across the second conductor is equal to the voltage drop across one of the third conductor and the fourth conductor, wherein a limit signal is output from an end of the constant current source in response to the voltage drop across the one of the third conductor and the fourth conductor being greater than the voltage drop across the second conductor.

According to one aspect of the present invention, in order to detect a limit current, the second current detector circuit may include a constant current source supplying the limit current to the second conductor, so that the limit signal having no temperature dependence can be output from one end of the constant current source when the voltage drop across one of the third conductor and the fourth conductor is greater than the voltage drop across the second conductor.

Additionally, in any of the above-described current detector circuits, the first conductor may employ the ON-resistance of a first MOS transistor, the second conductor may employ the ON-resistance of a second MOS transistor, the third conductor may employ the ON-resistance of a third MOS transistor, and the fourth conductor may employ the ON-resistance of a fourth MOS transistor; and the second MOS transistor may be ON at least when the first MOS transistor is ON, or the second MOS transistor, the third MOS transistor, and the fourth MOS transistor may be ON at least when the first MOS transistor is ON. Further, at least the third MOS transistor and the fourth MOS transistor may be OFF when the first MOS transistor is OFF in order to enable conduction and interruption of the load current.

Additionally, in any of the above-described current detector circuits, the first conductor and the second conductor may be integrated onto a single-chip semiconductor substrate, or the first conductor, the second conductor, the third conductor, and the fourth conductor may be integrated onto a single-chip semiconductor substrate. As a result, it is possible to improve temperature compensation accuracy.

According to one embodiment of the present invention, there is provided a current-mode DC-DC converter including any of the above-described current detector circuits, wherein the current detector circuit is configured to detect the inductor current of the current-mode DC-DC converter. As a result, it is possible to achieve a current-mode DC-DC converter having excellent temperature stability.

Additionally, in the current-mode DC-DC converter, the first conductor may employ the ON-resistance of a first MOS transistor, the second conductor may employ the ON-resistance of a second MOS transistor, the third conductor may employ the ON-resistance of a third MOS transistor, and the fourth conductor may employ the ON-resistance of a fourth MOS transistor; the second MOS transistor, the third MOS transistor, and the fourth MOS transistor may be ON at least when the first MOS transistor is ON; and the first MOS transistor and the series circuit of the third MOS transistor and the fourth MOS transistor may form a circuit serving as a switching element of the current-mode DC-DC converter. As a result, it is possible to use a device for current detection also as a switching device.

According to one embodiment of the present invention, there is provided a current detector circuit detecting a limit current of a load current, the current detector circuit including a first MOS transistor through which the load current flows; a second MOS transistor having a temperature characteristic equal to the temperature characteristic of the resistance of the first MOS transistor; a third MOS transistor and a fourth MOS transistor each having a temperature characteristic equal to the temperature characteristic of the resistance of the first MOS transistor, the third MOS transistor and the fourth MOS transistor being connected in series so that the series connection is connected in parallel to the first MOS transistor; a constant current source configured to supply the limit current to the second MOS transistor; and a comparator circuit configured to compare the voltage drop across the second MOS transistor and the voltage drop across one of the third MOS transistor and the fourth MOS transistor, wherein a limit signal is output from the output of the comparator circuit in response to the voltage drop across the one of the third MOS transistor and the fourth MOS transistor being greater than the voltage drop across the second MOS transistor. As a result, it is possible to cancel temperature characteristics, so that it is possible to eliminate temperature dependence.

Thus, according to one aspect of the present invention, current detection is performed using a conductor for current restoration having the same temperature characteristics as a conductor for current detection. Accordingly, it is possible to completely cancel the temperature dependence of the conductor for current detection, so that it is possible to perform current detection with high accuracy.

Further, since the above current detector circuit is used to detect a limit current, it is possible to detect the limit current with high accuracy.

Further, since the above highly accurate current detector circuit is used to detect the inductor current of a current-mode DC-DC converter, it is possible to achieve a current-mode DC-DC converter having excellent temperature stability.

The present invention is not limited to the specifically disclosed embodiments, and variations and modifications may be made without departing from the scope of the present invention.

The present application is based on Japanese Priority Patent Application No. 2006-059494, filed on Mar. 6, 2006, the entire contents of which are hereby incorporated by reference.

What is claimed is:

1. A current detector circuit detecting a load current flowing through a load, the current detector circuit comprising:
a first series circuit having a first element, having a first temperature-dependent resistance, and the load connected in series;
a second series circuit having a second element, having a second temperature-dependent resistance, and a resistor connected in series to the second element, the second element having a temperature characteristic equal to a temperature characteristic of the first temperature-dependent resistance of the first element;
a power supply configured to supply voltage to the first series circuit and the second series circuit; and
a control circuit configured to control a voltage drop across the second element so that the voltage drop across the second element is equal to a voltage drop across the first element,
wherein a current detection signal corresponding to the load current is generated based on a current flowing through the second element.

2. The current detector circuit as claimed in claim 1, wherein the control circuit comprises:
an operational amplifier circuit to which the voltage drop across the first element and the voltage drop across the second element are input; and
a PMOS transistor inserted in the second series circuit and controlled by an output of the operational amplifier circuit.

3. The current detector circuit as claimed in claim 1, wherein;
the first element includes a first MOS transistor and the resistance of the first element includes an ON-resistance of the first MOS transistor, and the second element includes a second MOS transistor and the resistance of the second element includes an ON-resistance of the second MOS transistor; and the second MOS transistor is ON at least when the first MOS transistor is ON.

4. The current detector circuit as claimed in claim 1, wherein the first element and the second element are integrated onto a single-chip semiconductor substrate.

5. A current-mode DC-DC converter, comprising:
the current detector circuit as claimed in claim 1,
wherein the current detector circuit is configured to detect an inductor current of the current-mode DC-DC converter.

6. A current detector circuit detecting a load current flowing through a load, the current detector circuit comprising:
a first series circuit having a first element, having a first temperature-dependent resistance, and the load connected in series;
a second series circuit having a second element, having a second temperature-dependent resistance, and a resistor connected in series to the second element, the second element having a temperature characteristic equal to a temperature characteristic of the first temperature-dependent resistance of the first element;
a third series circuit connected in parallel to the first element, the third series circuit having a third element and a fourth element connected in series, the third element and the fourth element each having a temperature characteristic equal to the temperature characteristic of the first temperature-dependent resistance of the first element;
a power supply configured to supply voltage to the first series circuit, the second series circuit, and the third series circuit; and
a control circuit configured to control a voltage drop across the second element so that the voltage drop across the second element is equal to a voltage drop across one of the third element and the fourth element,
wherein a current detection signal corresponding to the load current is generated based on a current flowing through the second element.

7. The current detector circuit as claimed in claim 6, wherein the control circuit comprises:
an operational amplifier circuit to which the voltage drop across the second element and the voltage drop across the one of the third element and the fourth element are input; and
a PMOS transistor inserted in the second series circuit and controlled by an output of the operational amplifier circuit.

8. The current detector circuit as claimed in claim 6, wherein;
the first element includes a first MOS transistor and the resistance of the first element includes an ON-resistance of the first MOS transistor, the second element includes a second MOS transistor and the resistance of the second element includes an ON-resistance of the second MOS transistor, the third element includes a third MOS transistor and the resistance of the third element includes an ON-resistance of all the third MOS transistor, and the fourth element includes a fourth MOS transistor and the resistance of the fourth element includes an ON-resistance of the fourth MOS transistor; and
the second MOS transistor, the third MOS transistor, and the fourth MOS transistor are ON at least when the first MOS transistor is ON.

9. The current detector circuit as claimed in claim 8, wherein at least the third MOS transistor and the fourth MOS transistor are OFF when the first MOS transistor is OFF.

10. The current detector circuit as claimed in claim 6, wherein the first element, the second element, the third element, and the fourth element are integrated onto a single-chip semiconductor substrate.

11. A current-mode DC-DC converter, comprising:
the current detector circuit as claimed in claim 6,
wherein the current detector circuit is configured to detect an inductor current of the current-mode DC-DC converter.

12. The current-mode DC-DC converter as claimed in claim 11, wherein:
the first element includes a first MOS transistor and the resistance of the first element includes an ON-resistance of the first MOS transistor, the second element includes a second MOS transistor and the resistance of the second element includes an ON-resistance of the second MOS transistor, the third element includes a third MOS transistor and the resistance of the third element includes an ON-resistance of the third MOS transistor, and the fourth element includes a fourth MOS transistor and the resistance of the fourth element includes an ON-resistance of the fourth MOS transistor;
the second MOS transistor, the third MOS transistor, and the fourth MOS transistor are ON at least when the first MOS transistor is ON; and
the first MOS transistor and the third series circuit of the third MOS transistor and the fourth MOS transistor form a circuit serving as a switching element of the current-mode DC-DC converter.

13. A current detector circuit detecting a load current flowing through a load, the current detector circuit comprising:
a first series circuit having a first element, having a first temperature-dependent resistance, and the load connected in series;
a second series circuit having a second element, having a second temperature-dependent resistance, and a constant current source connected in series to the second element, the second element having a temperature characteristic equal to a temperature characteristic of the first temperature-dependent resistance of the first element the constant current source being configured to supply a limit current;
a power supply configured to supply voltage to the first series circuit and the second series circuit; and
a control circuit configured to control a voltage drop across the second element so that the voltage drop across the second element is equal to a voltage drop across the first element,
wherein a limit signal is output from an end of the constant current source in response to the voltage drop across the first element being greater than the voltage drop across the second element.

14. The current detector circuit as claimed in claim 13, wherein the circuit comprises:
an operational amplifier circuit to which the voltage drop across the first element and the voltage drop across the second element are input; and
a PMOS transistor inserted in the second series circuit and controlled by an output of the operational amplifier circuit.

15. The current detector circuit as claimed in claim 13, wherein;
the first conductor element includes a first MOS transistor and the resistance of the first element includes an ON-resistance of the first MOS transistor, and the second element includes a second MOS transistor and the resistance of the second element includes an ON-resistance of the second MOS transistor; and the second MOS transistor is ON at least when the first MOS transistor is ON.

16. The current detector circuit as claimed in claim 13, wherein the first element and the second element are integrated onto a single-chip semiconductor substrate.

17. A current-mode DC-DC converter, comprising:
the current detector circuit as claimed in claim 13,
wherein the current detector circuit is configured to detect an inductor current of the current-mode DC-DC converter.

18. A current detector circuit detecting a load current flowing through a load, the current detector circuit comprising:
a first series circuit having a first element, having a first temperature-dependent resistance, and the load connected in series;
a second series circuit having a second element, having a second temperature-dependent resistance, and a constant current source connected in series to the second element, the second element having a temperature characteristic equal to a temperature characteristic of the first temperature-dependent resistance of the first element, the constant current source being configured to supply a limit current;
a third series circuit connected in parallel to the first element, the third series circuit having a third element and a fourth element connected in series, the third element and the fourth element each having a temperature characteristic equal to the temperature characteristic of the temperature-dependent resistance of the first element;
a power supply configured to supply voltage to the first series circuit, the second series circuit, and the third series circuit; and
a control circuit configured to control a voltage drop across the second element so that the voltage drop across the second element is equal to a voltage drop across one of the third element and the fourth element,
wherein a limit signal is output from an end of the constant current source in response to the voltage drop across the one of the third element and the fourth element being greater than the voltage drop across the second element.

19. The current detector circuit as claimed in claim 18, wherein the control circuit comprises:
an operational amplifier circuit to which the voltage drop across the second element and the voltage drop across the one of the third element and the fourth element are input; and
a PMOS transistor inserted in the second series circuit and controlled by an output of the operational amplifier circuit.

20. The current detector circuit as claimed in claim 18, wherein:
the first element includes a first MOS transistor and the resistance of the first element includes an ON-resistance of the first MOS transistor, the second element includes a second MOS transistor and the resistance of the second element includes an ON-resistance of the second MOS transistor, the third element includes a third MOS transistor and the resistance of the third element includes an ON-resistance of the third MOS transistor, and the fourth element includes a fourth MOS transistor and the resistance of the fourth element includes an ON-resistance of the fourth MOS transistor; and the second MOS transistor, the third MOS transistor, and the fourth MOS transistor are ON at least when the first MOS transistor is ON.

21. The current detector circuit as claimed in claim 20, wherein at least the third MOS transistor and the fourth MOS transistor are OFF when the first MOS transistor is OFF.

22. The current detector circuit as claimed in claim 18, wherein the first element, the second element, the third element, and the fourth element are in integrated onto a single-chip semiconductor substrate.

23. A current-mode DC-DC converter, comprising:
the current detector circuit as claimed in claim 18,
wherein the current detector circuit is configured to detect an inductor current of the current-mode DC-DC converter.

24. The current-mode DC-DC converter as claimed in claim 23, wherein:
the first element includes a first MOS transistor and the resistance of the first element includes an ON-resistance of the first MOS transistor, the second element includes a second MOS transistor and the resistance of the second element includes an ON-resistance of the second MOS transistor, the third element includes a third MOS transistor and the resistance of the third element includes an ON-resistance of the third MOS transistor, and the fourth element includes a fourth MOS transistor and the resistance of the fourth element includes an ON-resistance of the fourth MOS transistor;
the second MOS transistor, the third MOS transistor, and the fourth MOS transistor are ON at least when the first MOS transistor is ON; and
the first MOS transistor and the third series circuit of the third MOS transistor and the fourth MOS transistor form a circuit serving as a switching element of the current-mode DC-DC converter.

25. A current detector circuit detecting a limit current of a load current, the current detector circuit comprising:
a first MOS transistor through which the load current flows;
a second MOS transistor having a temperature characteristic equal to a temperature characteristic of a resistance of the first MOS transistor;
a third MOS transistor and a fourth MOS transistor each having a temperature characteristic equal to the temperature characteristic of the resistance of the first MOS transistor, the third MOS transistor and the fourth MOS transistor being connected in series so that the series connection is connected in parallel to the first MOS transistor;
a constant current source configured to supply the limit current to the second MOS transistor; and
a comparator circuit configured to compare a voltage drop across the second MOS transistor and a voltage drop across one of the third MOS transistor and the fourth MOS transistor,
wherein a limit signal is output from an output of the comparator circuit in response to the voltage drop across the one of the third MOS transistor and the fourth MOS transistor being eater than the voltage drop across the second MOS transistor.

* * * * *